(12) United States Patent
West et al.

(10) Patent No.: US 7,993,470 B2
(45) Date of Patent: Aug. 9, 2011

(54) FABRICATING AND CLEANING CHAMBER COMPONENTS HAVING TEXTURED SURFACES

(75) Inventors: Brian T West, San Jose, CA (US); Marc O Schweitzer, San Jose, CA (US); Jennifer L Watia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/316,834

(22) Filed: Dec. 16, 2008

(65) Prior Publication Data

US 2009/0120462 A1    May 14, 2009

Related U.S. Application Data

(60) Continuation of application No. 11/874,169, filed on Oct. 17, 2007, now abandoned, which is a division of application No. 10/653,713, filed on Sep. 2, 2003, now abandoned.

(51) Int. Cl.
*B08B 7/00* (2006.01)

(52) U.S. Cl. .......... 134/22.18; 134/26; 134/1; 134/22.1

(58) Field of Classification Search ................ None
See application file for complete search history.

(56) References Cited

U.S. PATENT DOCUMENTS

| | | |
|---|---|---|
| 5,391,275 A | 2/1995 | Mintz |
| 5,401,319 A | 3/1995 | Banholzer et al. |
| 5,474,649 A | 12/1995 | Kava et al. |
| 5,527,203 A | 6/1996 | Cook et al. |
| 5,797,586 A | 8/1998 | Schulte |
| 5,910,338 A | 6/1999 | Donde et al. |
| 5,916,454 A | 6/1999 | Richardson et al. |
| 6,283,840 B1 | 9/2001 | Huey |
| 6,368,410 B1 * | 4/2002 | Gorczyca et al. ............ 118/715 |
| 6,405,399 B1 * | 6/2002 | Farber et al. .................... 15/77 |
| 6,554,010 B1 | 4/2003 | Hirose et al. |
| 6,565,667 B2 | 5/2003 | Haerle et al. |
| 6,571,472 B2 | 6/2003 | Berry et al. |
| 6,669,538 B2 | 12/2003 | Li et al. |
| 6,790,289 B2 | 9/2004 | Takase et al. |

(Continued)

FOREIGN PATENT DOCUMENTS

EP    0 626 228 A1    11/1994

(Continued)

OTHER PUBLICATIONS

Thermal Spraying: Practice, Theory, and Application. American Welding Society, Inc. 1985. pp. 17 and 24.*

(Continued)

*Primary Examiner* — Michael Kornakov
*Assistant Examiner* — Nicole Blan
(74) *Attorney, Agent, or Firm* — Janah & Associates, P.C.

(57) ABSTRACT

A method of fabricating a substrate processing chamber component involves forming a component having a textured surface and sweeping a jet of pressurized fluid across the textured surface of the component. The jet of fluid is pressurized sufficiently high to dislodge substantially all the particles from the textured surface. The method can be applied to dislodge grit particles from textured exposed surfaces formed by electromagnetic energy beam scanning and grit blasting. The method can also be applied to remove loosely adhered coating particles from the textured surfaces of coated components.

21 Claims, 4 Drawing Sheets

U.S. PATENT DOCUMENTS

| | | |
|---|---|---|
| 6,805,952 B2 | 10/2004 | Chang et al. |
| 6,812,471 B2 | 11/2004 | Popiolkowski et al. |
| 6,902,628 B2 | 6/2005 | Wang et al. |
| 2002/0086118 A1 | 7/2002 | Chang et al. |
| 2003/0010353 A1 | 1/2003 | Kawasaki et al. |
| 2003/0026917 A1 | 2/2003 | Lin et al. |
| 2003/0064604 A1* | 4/2003 | Umeda .................. 438/745 |
| 2003/0073126 A1 | 4/2003 | Neuenhofer et al. |
| 2003/0118731 A1 | 6/2003 | He et al. |
| 2003/0173526 A1 | 9/2003 | Popiolkowski et al. |
| 2003/0196890 A1 | 10/2003 | Le et al. |
| 2003/0230323 A1* | 12/2003 | You et al. .................. 134/33 |
| 2004/0000327 A1* | 1/2004 | Somboli et al. ............ 134/21 |
| 2004/0003990 A1* | 1/2004 | Mansur .................... 202/176 |
| 2004/0056211 A1 | 3/2004 | Popiolkowski et al. |
| 2004/0099285 A1 | 5/2004 | Wang et al. |
| 2009/0000641 A1 | 1/2009 | Bao et al. |

FOREIGN PATENT DOCUMENTS

| | | |
|---|---|---|
| EP | 626228 A1 * | 11/1994 |
| EP | 1 258 908 A2 | 11/2002 |
| TW | 546680 | 8/2003 |
| WO | WO 01/45854 A1 | 6/2001 |
| WO | WO 01/75189 | 10/2001 |
| WO | WO 01/75189 A2 | 10/2001 |
| WO | WO 03/028909 A | 4/2003 |
| WO | WO-2005/021173 A1 | 3/2005 |

OTHER PUBLICATIONS

PCT Search Report of PCT/US2004/012193 (equiv. WO 2005/021173 A1, pp. 24-25).

Progressive Technologies, Inc., Waterjet Cleaning: www.PTIhome.com/water jet cleaning.php, retrieved Feb. 12, 2009.

Non-Final Office Action of U.S. Appl. No. 10/653,713 dated Aug. 3, 2005.

Final Office Action of U.S. Appl. No. 10/653,713 dated Apr. 17, 2007.

Advisory Action of U.S. Appl. No. 10/653,713 dated Oct. 2, 2007.

Non-Final Office Action of U.S. Appl. No. 11/874,169 dated May 9, 2008.

Final Office Action of U.S. Appl. No. 11/874,169 dated Oct. 15, 2008.

Advisory Action of U.S. Appl. No. 11/874,169 dated Dec. 22, 2008.

Non-Final Office Action of U.S. Appl. No. 11/874,169 dated Mar. 31, 2009.

Final Office Action dated Oct. 28, 2009 in U.S. Appl. No. 11/874,169, entitled "Method of fabricating chamber components having textured surfaces".

* cited by examiner

FABRICATING AND CLEANING CHAMBER COMPONENTS HAVING TEXTURED SURFACES

CROSS REFERENCE

This application is a continuation of U.S. patent application Ser. No. 11/874,169, entitled, "Fabricating and Cleaning Chamber Components Having Textured Surfaces," to West et al., filed on Oct. 17, 2007 now abandoned, which is a divisional of U.S. patent application Ser. No. 10/653,713, entitled, "Fabricating and Cleaning Chamber Components Having Textured Surfaces," to West et al., filed on Sep. 2, 2003 now abandoned, incorporated by reference herein.

BACKGROUND

The present invention relates to the fabrication and cleaning of components used in substrate processing chambers.

In the processing of substrates, such as semiconductor wafers and displays, a substrate is placed in a process chamber and exposed to an energized gas to, for example, deposit material on or etch features in, the substrate. During such processing, process residues are generated and deposited on internal surfaces in the chamber. In subsequent process cycles, the deposited process residues can "flake off" of the chamber surfaces and fall on the substrate to contaminate the substrate. Consequently, the deposited process residues are periodically cleaned from the chamber surfaces. In wet cleaning processes, the process residues are cleaned off the chamber surfaces by scrubbing or pressure washing the components with cleaning solutions between process cycles. Dry cleaning processes use a plasma of cleaning gas to clean the exposed portions of the components in the chamber. However, such cleaning processes increase chamber down-time to lower yields and increase capitalization costs. Thus, it is desirable to reduce cleaning cycles and increase the number of substrate processing cycles between cleaning cycles.

Forming a textured surface on the chamber components can reduce flaking-off of the process residues. The process residues adhere better to the textured surfaces thereby reducing residue flaking and/or allowing a larger number of process cycles to be performed between cleaning cycles. Such a textured coating can be formed, for example, by directing an energetic beam of photons, particles or molten material against the surface of component. However, the particles used to form the coating themselves become trapped in the depressions of the coating, and when subsequently loosened during thermal cycling of the process chamber or through exposure to the energized process gas, fall on and contaminate the substrate being processed in the chamber. The trapped particles can also reduce adherence of process residues to the textured component surface by blocking depressions and cavities in which the process residues would otherwise collect. Conventional methods of cleaning the textured surface include rinsing the component surface with chemical solutions, ultrasonically agitating the component, and passing nitrogen at a pressure of about (345 Kpa) 50 PSI over the component surface to remove entrapped particles from the textured surface. However, these methods often fail to remove all the lodged particles, and the components cleaned by these methods can provide reduced substrate yields during processing of the substrates.

The textured surfaces can also have particles, for example, of a coating material, that are loosely adhered to the component surface. The loose particles can be subsequently knocked off during processing of substrates to contaminate the substrates. In one method of removing the loosely adhered coating particles, the component is gently tapped to shake off the loose particles from the component. However, tapping does not always typically remove all the loose particles because a strong tapping force can damage the component. In subsequent process cycles, remaining loose particles flake off and contaminate the substrate. The tapping method also depends upon the operator and may not be consistently reproducible, with the results varying from one operator to another. Furthermore, excessive tapping force can structurally damage the coating and create even more loose particles.

Accordingly, it is desirable to have a method of cleaning chamber components, which removes undesirable particles from the components, such as entrapped particles and loose coating particles. It is further desirable to have a chamber component capable of processing a large number of substrates without undergoing cleaning and while reducing contamination levels. It is also desirable to have an efficient cleaning process that does not damage the component or its surface.

SUMMARY

A method of cleaning a substrate processing chamber component involves providing a component having a textured surface and sweeping a jet of pressurized fluid across the textured surface of the component. The jet of fluid is pressurized sufficiently high to dislodge adhered or loose particles from the textured surface.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
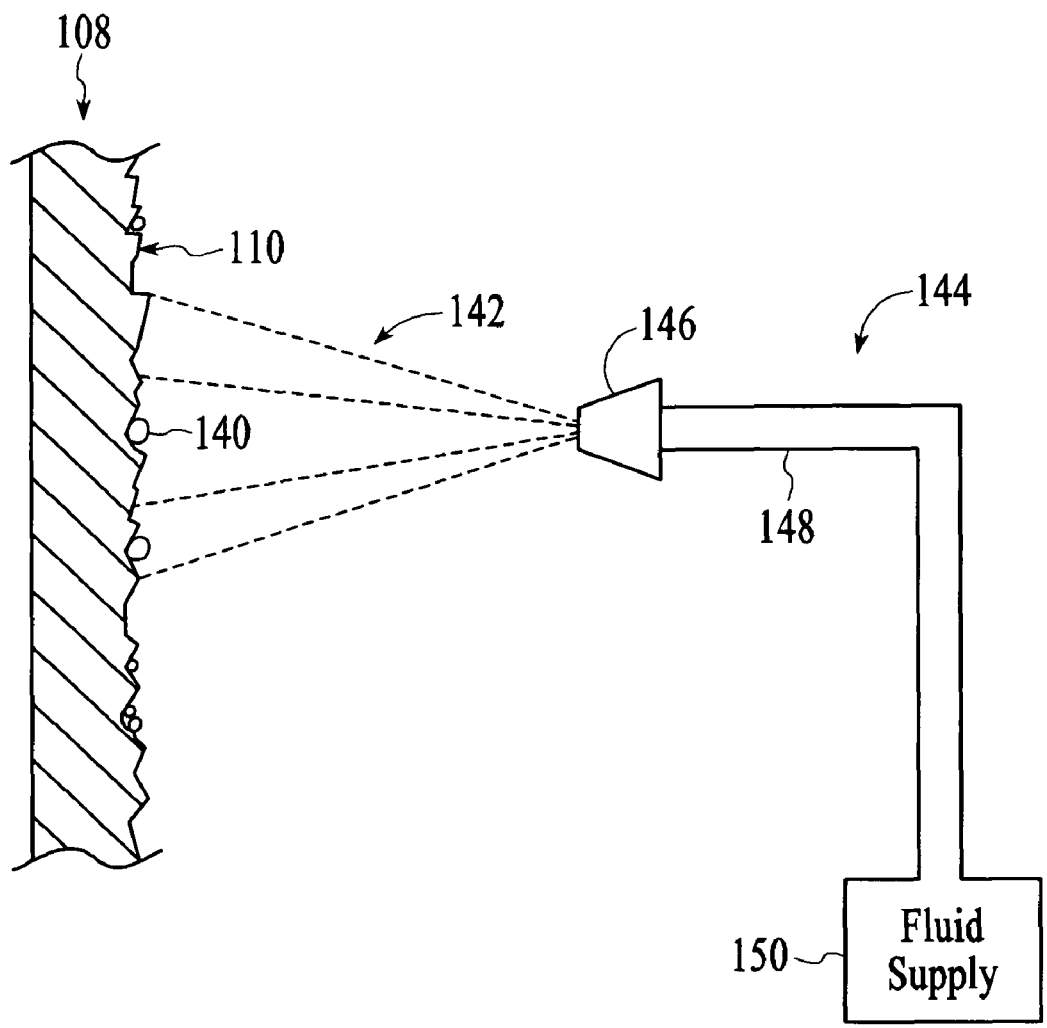
FIG. 1 is a schematic side view of an embodiment of a fluid jet spraying device capable of sweeping a jet of fluid across a textured surface of a process chamber component.

A substrate processing chamber 106 comprises one or more components 108 having a textured surface 110. The textured surface 110 is at least partially exposed to the process environment in the process chamber 106, and typically has corrosion resistance to energized process gas used to process a substrate 104. The textured surface 110 provides a convoluted surface topography to which process residues adhere, thereby reducing flaking of process residues and the resultant contamination of the substrates. For example, the textured surface 110 can have features 111 such as protuberances, depressions, cavities, crevices, or pores, as shown in FIG. 1.

Figure 4:
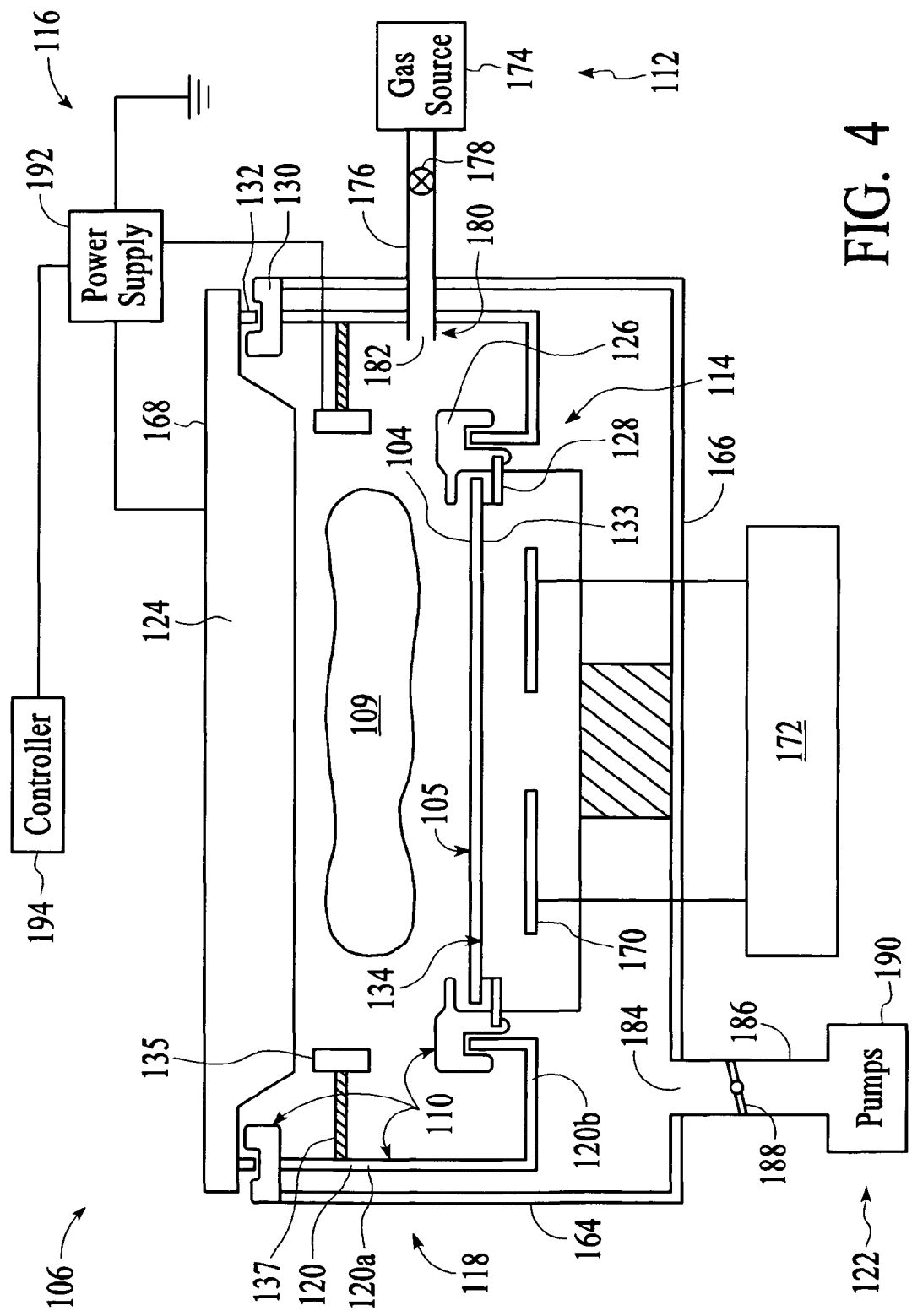
FIG. 4 is a sectional side view of an embodiment of a process chamber having one or more components with a textured surface.

Components 108 having the textured surface 110 can include portions of one or more of a gas delivery system 112 that provides process gas in the chamber 106, a substrate support 114 that supports the substrate 104 in the chamber 106, a gas energizer 116 that energizes the process gas, chamber enclosure walls 118 and shields 120, and a gas exhaust 122 that exhausts gas from the chamber 106, as shown for example in FIG. 4. For example, in a physical vapor deposition chamber 106, the components having the textured surface 110 can comprise at least one of a chamber enclosure wall 118, a chamber shield 120, a target 124, a cover ring 126, a deposition ring 128, a support ring 130, insulator ring 132, a coil 135, coil support 137, shutter disk 133, and a surface 134 of the substrate support 114. The textured surface 110 can be formed by methods including grit blasting, electromagnetic energy beam scanning, CVD or PVD deposition, plasma spraying, twin arc spraying, other thermal spraying methods and combinations thereof.

In the manufacture or refurbishment of a component 108 having a textured surface 110, contamination of the surface 110 can occur from particles 140 that are generated during the manufacturing process or refurbishment process and that remain on the textured surface 110. These particles 140 are often difficult to remove as the particles can become stuck or wedged within crevices or other features 111 of the textured surface 110. However, removal of the particles 140 is highly desired, as the particles can otherwise become loose during thermal cycling of the chamber 106 or via interactions with the energized process gas, and can fall from the textured surface 110 onto the substrate 104. The particles 140 can also reduce the adherence of the process residues to the surface 110 by blocking the surface cavities and crevices where the residues would otherwise collect.

It has been discovered that the textured surface 110 can be cleaned to dislodge the particles 140 by sweeping a jet 142 of pressurized fluid across the textured surface, as shown in FIG. 1. It is believed that the pressurized fluid jet 142 creates a high pressure area under the particles 140 and forces the particles 140 out of the cavities and crevices of the textured surface 110. The fluid jet is desirably pressurized sufficiently high to dislodge adhered or loose particles from the textured surface. The fluid jet may even be pressurized sufficiently high to provide a textured surface 110 that is substantially absent adhered or loose particles, such that substrates processed with the component are substantially uncontaminated by the particles. Depending upon the surface to be cleaned, a suitable pressurization level for the fluid jet 142 can be a pressurization level of at least 100 pounds per square inch (689 kilopascals), such as a level of from about 100 PSI (689 kPa) to about 5000 PSI (34,474 kPa), and even a level of from about 1000 PSI (6,895 kPa) to about 4000 PSI (27,579 kPa.) The level may even be at least 1900 PSI (13,100 kPa) to provide the desired level of surface cleanliness.

The fluid jet 142 spraying parameters are selected to provide optimum cleaning of the surface 110. For example, the angle of the fluid jet 142 with respect to the surface 110 can be from about 10 degrees to about 90 degrees. The fluid jet 142 can also fan out from a fluid nozzle 146 to sweep across a larger portion of the textured surface 110, for example, the fluid jet may fan out at an angle of from about zero degrees to about 45 degrees, such as an angle from about 10 degrees to about 30 degrees. The fluid jet 142 can be swept in a direction from one side of the component 108 to the other, in a circular motion, or in another fluid sweeping pattern. Multiple passes of the fluid jet 142 across the textured surface 110 can be made, with varying fan angles, sweeping angles and sweeping directions.

The chemical composition of the fluid jet 142 is selected according to the composition and structure of the surface 110 to be cleaned to provide good cleaning without excessively eroding the surface 110. For example, the fluid jet 142 can comprise water, and can even consist essentially of water. The water can comprise untreated or tap water, and can also comprise water that has been treated by de-ionization, reverse osmosis, ultra-violet radiation, carbon filtration, or a combination thereof.

An embodiment of a fluid jet spraying device 144 capable of generating the fluid jet is shown in FIG. 1. The fluid jet spraying device comprises a nozzle 146 that directs a fluid jet 142 towards the surface 110. The nozzle 146 is connected to a conduit 148 that is in communication with a fluid supply 150 to provide fluid to the nozzle 146. The nozzle 146 may be adjustable to control the pressure and spray angle of the fluid jet 142, and one or more flow control valves (not shown) may also be provided to control the flow of fluid to the nozzle 146. The stand-off distance between the nozzle 146 and the surface 110 is set to provide optimum cleaning of the surface 110, and may be from about 0.5 inches (~12.7 mm) to about 6.0 inches (~152 mm), such as about 1.5 inches (~38 mm).

Other cleaning steps can also be performed before or after the fluid jet cleaning step. For example, the textured surface 110 can be cleaned by passing a pressurized flow of nitrogen gas over the surface 110, such as nitrogen gas flow pressurized at from about 10 PSI (69 kPa) to about 80 PSI (552 kPa), such as about 50 PSI (345 kPa). The textured surface 110 can also be cleaned in an ultrasonic cleaning step, in which the surface 110 is immersed in a cleaning bath solution and sound waves are introduced into the cleaning bath to lightly agitate the surface 110. A chemical cleaning step can also be used to rinse the textured surface 110 with a chemical solution comprising, for example, an aqueous solution of one or more of HF and $HNO_3$ in a concentration of from about 3% to about 80% by volume. A grit blasting step can also be used to clean or re-texture the surface 110. While the fluid jet is used to fabricate components or in their refurbishment, the fluid jet cleaning step can also be used to remove process residues that accumulate on the surface 110 of the component 108 during processing of a substrate 104 in the process chamber 106

Figure 2A:
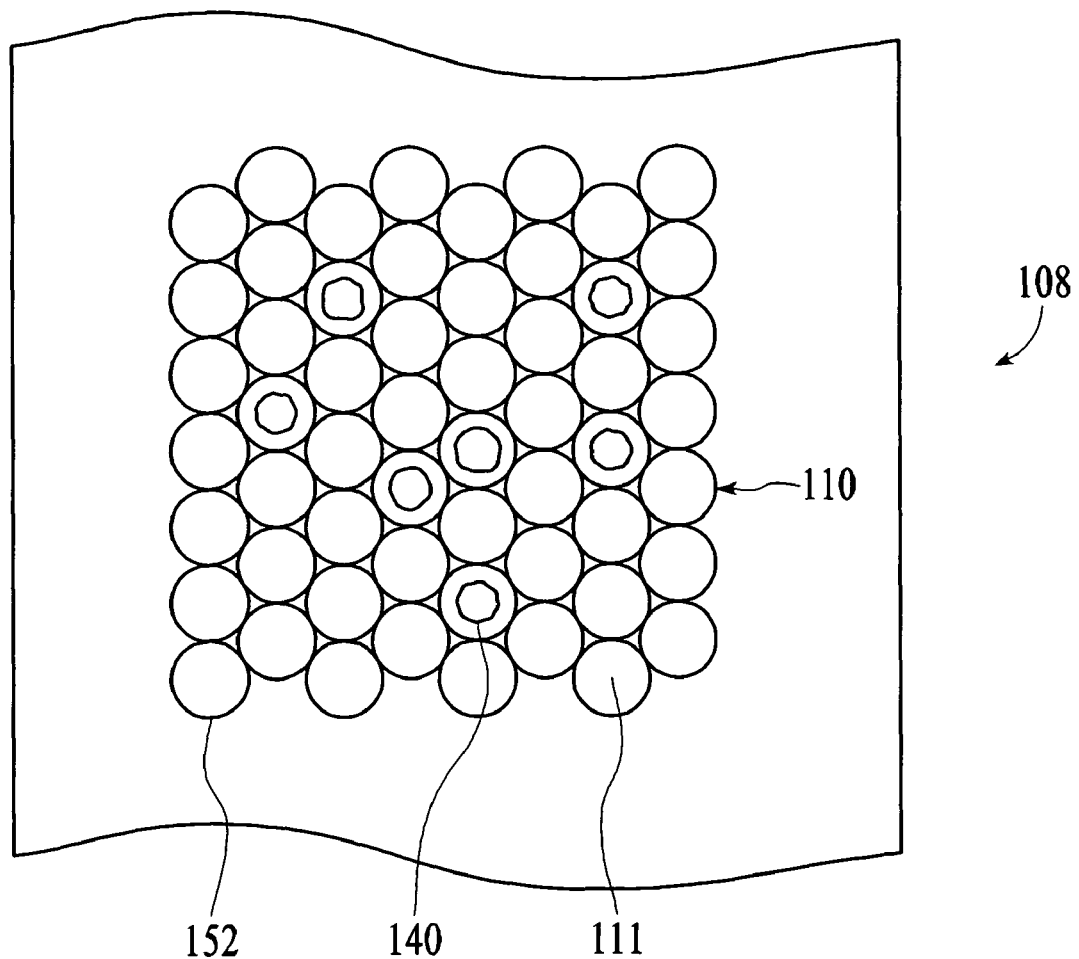
FIG. 2a is a sectional top view of an embodiment of a component having a textured surface formed by scanning an electromagnetic energy beam.
Figure 2B:
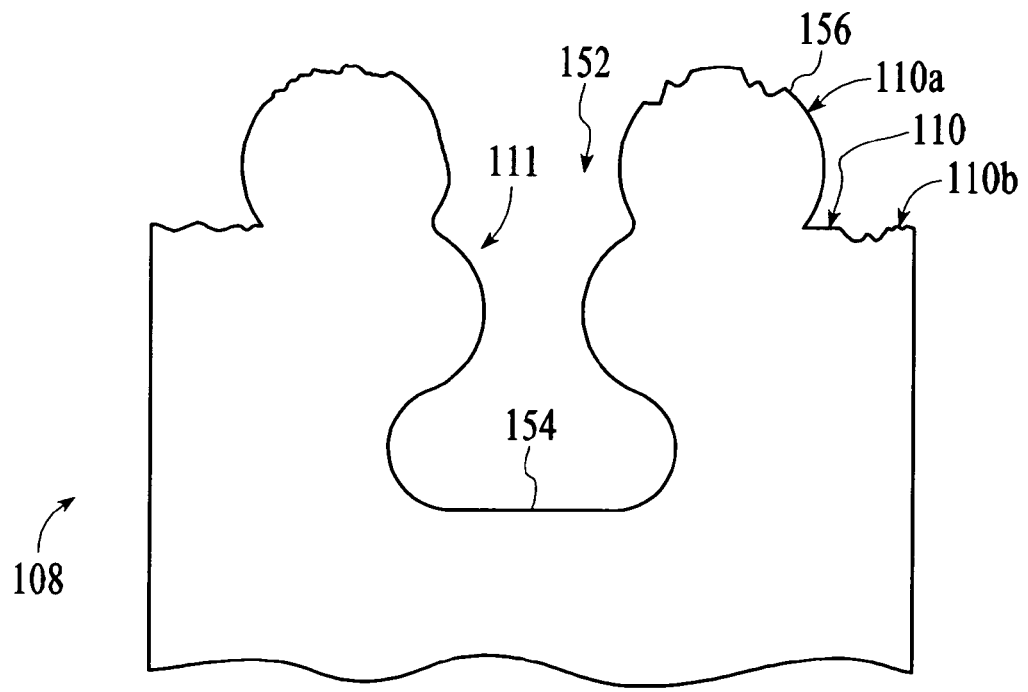
FIG. 2b is a sectional side view of the component of FIG. 2a after grit blasting of the component.

In one embodiment, the pressurized fluid jet cleaning step is applied to clean the surface 110 of a component 108 after the component surface 110 is textured by scanning an electromagnetic energy beam across the surface 110, and optionally, grit blasting the surface 110, as illustrated in FIGS. 2a and 2b. A "lavacoat" type textured surface, is described in U.S. patent application Ser. No. 10/099,307, filed Mar. 13, 2002, to Popiolkowski et al, and U.S. patent application Ser. No. 10/622,178, filed on Jul. 17, 2003 to Popiolkowski et al, both commonly assigned to Applied Materials, Inc., and both of which are incorporated herein by reference in their entireties. The components 108 comprise at least one of stainless steel, aluminum, tantalum, titanium, copper, aluminum, aluminum oxide and silicon oxide. To texture the surface 110, an electromagnetic energy beam is generated and directed onto the surface 110 of the component 108. The electromagnetic energy beam is preferably an electron beam, but can also comprise protons, neutrons and X-rays and the like. The electron beam is typically focused on a region 152 of the surface 110 for a period of time, during which time the beam interacts with the surface 110 form features 111 on the surface. It is believed that the beam forms the features 111 by rapidly heating the region 152 of the surface 110, in some cases to a boiling temperature of the surface material. The rapid heating causes some of the surface material to be ejected outwards, which forms depressions 154 in the regions the material was ejected from, and protuberances 156 in areas where the ejected material re-deposits, as shown in FIGS. 2a and 2b. After the desired features 111 in the region 152 are formed, the beam is scanned to a different region 152 of the component surface 110 to form features 111 in the new region 152. FIG. 2a shows one version of a surface textured in the described process, with the final surface 110 having a honey-comb-like structure of depressions and protuberances formed in the surface 110. The features 111 formed by this method are typically macroscopically sized, and the depressions 154 can range in diameter from about 0.1 mm to about 3.5 mm, such as from about 0.8 to about 1.0 mm in diameter. The textured surface 110 has an overall surface roughness average of from about 2500 microinches (63.5 micrometers) to about 4000 microinches (101.6 micrometers), the roughness average of the surface 110 being defined as the mean of the absolute values of the displacements from the mean line of the features 111 along the textured surface 110. In the Lavacoat surface, the macroscopic depressions and protuberances adhere the process residues.

Subsequently, a grit blasting texturing process can be performed to overlay the initial macroscopic textured surface 110a with a second finely textured surface 110b. The grit blasting process improves adhesion of process residues to the surface 110 by texturing regions that could otherwise be smooth, such as the surface of the protuberances 156 and regions between the macroscopic features, as shown in FIG. 2b. Grit blasting also removes loose particles of material generated during the electromagnetic energy beam process. In the grit blasting process, a stream of hard grit particles is propelled toward the textured surface 110 by air at a pressure that is sufficiently high to cause the grit particles to erode the surface 110. For example, a suitable pressure may be from about 35 kPa (5 PSI) to about 483 kPa (70 PSI). The grit particles desirably comprise a material having a hardness that is higher than that of the surface to allow the grit particles to erode and texture the surface 110. For example, the grit particles can comprise at least one of aluminum oxide, garnet, silicon oxide and silicon carbide, and can have a particle size of from about 24 grit to about 80 grit, such as from about 686 micrometers to about 192 micrometers. The grit blasting process desirably provides an overlying surface 110 having a roughness average of from about 80 microinches (2.0 micrometers) to about 450 microinches (11.4 micrometers). The grit blasting process can also be performed to refurbish the component 108 after processing of a number of substrates 104, for example to remove process residues from the surface 110 and to at least partially re-texture the surface 110.

After the electromagnetic energy beam and grit blasting processes, a fluid jet cleaning step is performed to dislodge grit particles 140 that become lodged in the relatively large macroscopic features 111 formed by the electromagnetic energy beam. The fluid jet 142 is swept across the textured exposed surface 110 with the jet spraying parameters, such as the fluid pressure, sweeping angle, fan angle, direction and stand-off distance set to remove the grit particles from the surface 110. For example, a pressure of the fluid jet 142 suitable for removing the grit particles 140 may be at least 13100 kPa (1900 PSI). The fluid jet cleaning process has been found to remove entrapped the grit particles 140 without damaging or excessively eroding the component surface 110.

In another version, the pressurized fluid jet cleaning step is performed to refurbish the component 108 after the component 108 has been used in the processing of substrates 104. The refurbishment process typically at least partially resurfaces or re-textures the surface 110 of the component 108 to provide good process performance. The refurbishment process can also remove process residues that are adhered to the surface 110. For example, a grit blasting step can be used to at least partially re-texture the surface and to remove remaining process residues. The pressurized fluid jet cleaning step is then performed to remove any grit particles 140 remain entrapped on the surface 110 during the grit blasting step. A chemical cleaning step can also be performed before or after the grit blasting step to remove process residues by rinsing the component 108 in a chemical solution comprising, for example, at least one of HF and $HNO_3$ in a concentration of from about 3 to about 80% by weight. Other cleaning steps, such as at least one of an ultrasonic cleaning step, de-ionized water cleaning step, and pressurized $N_2$ cleaning step can also be performed before or after the pressurized fluid jet cleaning step, and the cleaning steps can be repeated and performed in different process sequences.

A comparative study showing the improved grit removal performance of the fluid jet cleaning step over cleaning with an ultrasonic de-ionized water rinse and pressurized $N_2$ gas was performed. The comparative study involved the cleaning of two ring-like components, a deposition ring 128 and a cover ring 126, the components 108 having surfaces 110 textured by electromagnetic energy beam scanning and grit blasting. The components 108 were initially cleaned by immersing the components in an ultrasonic de-ionized water bath and by flowing $N_2$ gas pressurized to about 50 PSI (345 kPa) over the surfaces 110 of the components 108. The number of grit particles remaining after the ultrasonic and pressurized $N_2$ gas cleaning process were counted and mapped by visual inspection of the surfaces 110 under a microscope.

A fluid jet cleaning process was then performed to remove particles remaining on the surfaces 110 of the components 108 after the ultrasonic and pressurized $N_2$ cleaning processes. Each surface 110 was cleaned by sweeping a fluid jet 142 comprising water pressurized to 1900 PSI (13100 kPa) across the surface 110. The water jet was generated by a nozzle 146 set at a distance of from about 3 inches (76.2 mm) to about 4 inches (101.6 mm) from the textured surface 110, and having the nozzle opening size set to fan the water jet out from the nozzle 146 to cover about a 1 inch (25.4 mm) spot on the surface 110. Multiple passes of the water jet 142 were swept over each surface to clean the surfaces 110. In the first two passes, the water jet 142 was maintained at an angle of 90 degrees with respect to the surface 110. In the third pass, the water jet 142 was maintained at an angle of 45 degrees and was swept in a clockwise direction around the circumference of the component 108. In the fourth pass, the water jet 142 was maintained at an angle of 45 degrees and was swept in a counterclockwise direction around a circumference of the component 142. The number of particles 140 remaining on each component 108 were then counted by visual inspection of the components 108 under a microscope. The results of the comparative cleaning study are shown in Table 1 below.

TABLE 1

| Component | Number of Particles after $N_2$/Ultrasonic Cleaning | Number of Particles after Pressurized Fluid Jet Cleaning | Percent Particle Removal |
| --- | --- | --- | --- |
| Deposition Ring | 71 | 2 | 97 |
| Cover Ring | 46 | 0 | 100 |

Table 1 shows that the ultrasonic de-ionized water rinse and pressurized $N_2$ flow cleaning steps did not sufficiently clean the components 108, as 71 and 46 particles remained on the textured surfaces of the deposition ring 128 and cover ring 126, respectively. However, after the pressurized fluid jet cleaning, only 2 particles remained on the deposition ring 128, and the cover ring 126 had been completely cleaned of particles, giving overall cleaning percentages of 97 and 100 percent respectively. Also, upon visual examination, the pressurized fluid did not appear to have damage the textured surfaces of the components. Thus the comparative study shows that cleaning with the fluid jet 142 unexpectedly improves cleaning over ultrasonic and pressurized $N_2$ gas cleaning steps, and can almost completely remove the undesirable grit particles 140 from textured component surfaces 110, without damaging the surfaces.

Figure 3:
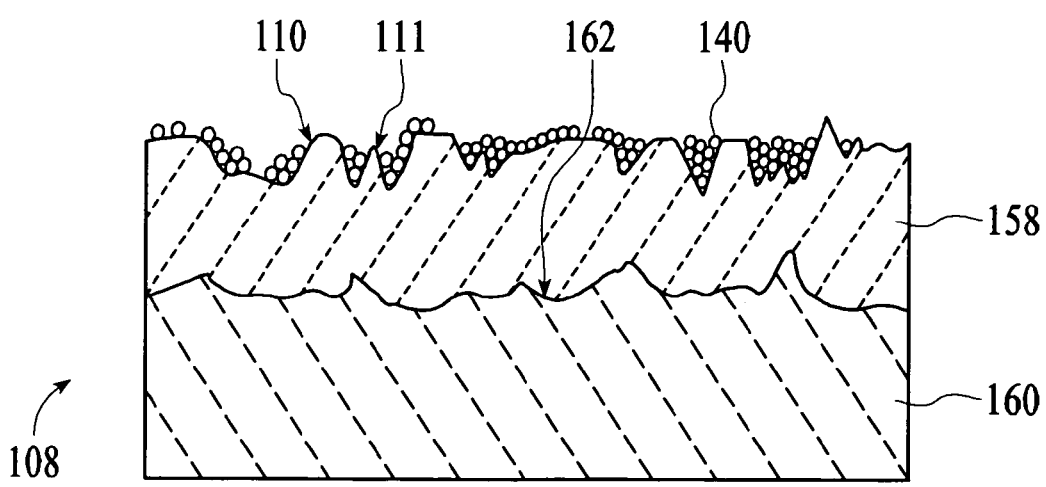
FIG. 3 is a sectional side view of an embodiment of a component having a coating with a textured surface thereon.

In another embodiment, the pressurized fluid jet cleaning step is applied to clean the textured surface 110 of a coating 158 on an underlying structure 160 of a component 108, as shown for example in FIG. 3. The textured coating 158 is desirably formed of a material that imparts improved corrosion resistance and enhances adhesion of process residues to the surface 110. One type of textured coating 158 comprises a metal coating, such as aluminum, silicon, titanium, copper, chromium, or mixtures thereof, as described in U.S. patent application Ser. No. 10/126,333, filed on Apr. 19, 2002 to Lin et al.; U.S. patent application Ser. No. 10/032,387, filed on Dec. 21, 2001 to He et al.; and U.S. patent application Ser. No. 10/304,535, filed on Nov. 25, 2002 to Wang et al.; all assigned to Applied Materials and all of which are herein incorporated by reference in their entireties. The textured coating 158 can also comprise a dielectric coating comprising aluminum oxide, titanium oxide and boron carbide, as described for example in aforementioned U.S. patent application Ser. No. 09/895,862, filed on Jun. 27, 2001 to Lin et al, all assigned to Applied Materials, which is also herein incorporated by reference in its entirety. The underlying structure 160 can comprise, for example, at least one of stainless steel, aluminum, titanium, copper, tantalum, quartz, aluminum oxide, silicon carbide, aluminum nitride and silicon nitride and mixtures thereof.

The underlying structure 160 can be roughened to provide better adhesion of the coating 158 and to impart some or all of the texture to the overlying coating 158. In one version, a surface 162 of the underlying structure 160 is grit blasted to roughen the surface 162. In the grit blasting of an underlying surface 162 comprising a ceramic, suitable grit blasting conditions may comprise, for example, an air pressure used to propel the grit towards the surface 162 of from about 30 PSI (207 kPa) to about 100 PSI (689 kPa), and even from about 40 PSI (276 kPa) to about 60 PSI (414 kPa), The ceramic surface roughness average attained by the grit blasting may be from about 150 microinches (3.81 micrometers) to about 450 microinches (11.4 micrometers), and even less than about 150 microinches (3.81 micrometers), such as from about 60 microinches (1.5 micrometers) to about 140 microinches (3.56 micrometers). In the grit blasting of an underlying surface 162 comprising a metal, suitable grit blasting conditions may comprise, for example, an air pressure used to propel the grit towards the surface 110 of from about 20 PSI (138 kPa) to about 120 PSI (827 kPa), and even from about 60 PSI (414 kPa) to about 80 PSI (552 kPa), to attain a surface roughness of at least about 160 microinches (4.06 micrometers), and even at least about than about 170 microinches (4.32 micrometers), for example from about 175 microinches (4.45 micrometers) to about 350 microinches (8.89 micrometers). The grit blasting conditions and desired surface roughness average can be generally selected according to the composition and structure of the underlying structure 160 and coating 158, and thus are not limited to the examples described above. The grit blasting step can also be performed to refurbish a component 108 used in the processing of a number of substrates by resurfacing and re-texturing the underlying structure 160 to provide good adhesion of a subsequently applied coating 158.

A coating 158 having the textured surface 110 is applied over an underlying surface 162 of the component 108. The coating 158 may be applied by, for example, one or more of a chemical or physical deposition process, or by a flame spraying or thermal spraying method, such as a twin wire arc spray method, plasma spray method, or oxy-fuel gas flame method. For example, in a plasma spray method, a plasma spray torch forms a plasma that atomizes and at least partially liquefies a spray of particulate coating material injected through the plasma. The plasma may liquefy the coating material by heating the coating material to a temperature of thousands of degrees Celsius. The liquefied droplets of the coating material impinge at high velocities on the underlying surface 162 and rapidly solidify to form the conformal coating 158. In the twin wire arc spraying method, an electric arc is generated between consumable electrodes that at least partially liquefies the material on the electrodes while a carrier gas is passed between the electrodes, thereby propelling the molten material towards the surface 162 of the component to form the coating 158.

The plasma spraying and twin wire arc spraying conditions, such as the applied voltage, standoff distance and angle of incidence, can be selected to provide a coating 158 having the desired texture, for example by controlling the size of the molten coating droplets and modifying the pattern in which the molten coating material splatters upon impacting the surface to form "pancake" and "lamella" patterns. The resulting coating 158 has a textured surface 110 having features 111 that improve adhesion of process residues to the surface and reduce contamination of the substrate 104. The average roughness of the coating surface 110 may be from about 150 microinches (3.81 micrometers) to about 1700 microinches (43.18 micrometers), such as from about 400 microinches (101.6 micrometers) to about 1200 microinches (30.48 micrometers). For example, a coating 158 on an underlying structure 162 comprising a ceramic may comprise a textured surface 110 having an average roughness of at least about 150 microinches (3.81 micrometers), and even from about 400 microinches (101.6 micrometers) to about 500 microinches (12.7 micrometers). A coating on an underlying structure 162 comprising a metal may comprise a textured surface 110 having an average roughness of from about 900 microinches (22.86 micrometers) to about 1700 microinches (43.18 micrometers).

The fluid jet cleaning step is performed to clean any loose coating particles 140 that are generated during the coating deposition step, and that can be otherwise difficult to remove due to the textured nature of the coating surface 110. For example, particles of coating material that become loose or molten droplets of coating material that cool before impacting the surface 162 can become lodged in the textured surface 110 and are difficult to remove. Desirably, the fluid jet cleaning step comprises sweeping the textured surface 110 of the coating 158 with a jet of water that is pressurized to at least 200 PSI (1379 kPa), such as from about 500 PSI (3447 kPa) to about 2000 PSI (13,790 kPa), and even at least about 1900 PSI (13,100 kPa). Multiple passes of the fluid jet 142 over the surface 110 may be made at varying sweep angles, fan angles, directions and stand-off distances to provide optimum cleaning. The fluid jet cleaning step may also be a part of a multi-step cleaning process involving other cleaning steps, such as chemical, ultrasonic or pressurized $N_2$ cleaning steps.

In another embodiment, the fluid jet cleaning step is performed as a part of a refurbishment process to refurbish a coated component 108 that has been used to process a number of substrates 104. The refurbishment process may be performed to resurface or re-texture the surface 110 of the component 108, and may also be performed to remove process residues adhered to the surface 110 of the component 108. In one version, the refurbishment process comprises grit blasting the component 108. The grit blasting step is performed to at least partially remove the coating 158 from the underlying surface 162, and also to remove any remaining process residues and clean the underlying surface 162. A chemical cleaning step can also optionally be performed before or after the grit blasting step to remove the coating 158 and process residues. A suitable chemical cleaning step can comprise immersing the component 108 in a chemical solution comprising, for example, and acidic solution comprising at least one of HF, $HNO_3$, or HCl; or a basic solution comprising, for example, KOH. Once the underlying surface 163 has been grit blasted and cleaned, a fresh coating 158 is applied. The fluid jet cleaning step is then performed to remove any loose coating particles remaining after the coating application process. Other cleaning steps can also be performed and alternative cleaning step sequences can also be used An example of a suitable process chamber 106 having a component 108 cleaned in a fluid jet cleaning step is shown in FIG. 4. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, that is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment. One or more components 108 of the chamber 106 may be textured and then cleaned with fluid jet cleaning step described. Components suitable for the texturing and fluid jet cleaning can include, for example, Applied Materials Inc. component numbers: 0021-24032, 0020-47654, 0020-46349, 0020-43171, 0020-46649, 0020-44375, 0020-44438, 0020-45695, 0020-43498, 0190-11821, 0200-02359, 0021-17719, 0021-17718, 0021-23850, 0021-23853, 0021-23854, and 0040-21178.

The chamber 106 comprises a substrate support 130 to support the substrate in the sputter deposition chamber 106. The substrate support 130 may be electrically floating or may comprise an electrode 170 that is biased by a power supply 172, such as an RF power supply. The substrate support 130 can also comprise a shutter disk 133 that can protect the upper surface 134 of the support 130 when the substrate 104 is not present. In operation, the substrate 104 is introduced into the chamber 106 through a substrate loading inlet (not shown) in a sidewall 164 of the chamber 106 and placed on the support 130. The support 130 can be lifted or lowered by support lift bellows and a lift finger assembly (not shown) can be used to lift and lower the substrate onto the support 130 during transport of the substrate 104 into and out of the chamber 106.

The support 130 may also comprise one or more rings, such as a cover ring 126 and a deposition ring 128, which cover at least a portion of the upper surface 134 of the support 130 to inhibit erosion of the support 130. In one version, the deposition ring 128 at least partially surrounds the substrate 104 to protect portions of the support 130 not covered by the substrate 104. The cover ring 126 encircles and covers at least a portion of the deposition ring 128, and reduces the deposition of particles onto both the deposition ring 128 and the underlying support 130.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 120 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 4, the shield 120 has an upper section 120a mounted to the support ring 130 and a lower section 120b that is fitted to the cover ring 126. Alternative shield configurations, such as inner and outer shields, can also be provided. In one version, one or more of the power supply 192, target 124, and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 130 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 130 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other chamber components than the exemplary components described herein can also be cleaned. Different cleaning solutions can also be used in the pressurized cleaning step. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of cleaning a substrate processing chamber component, the method comprising:
    (a) scanning an electromagnetic energy beam across a surface of a substrate processing chamber component to form a textured surface; and
    (b) sweeping a jet of pressurized fluid across the textured surface of the component, the jet of fluid (i) consisting essentially of water, and (ii) being pressurized sufficiently high to dislodge particles from the textured surface.

2. A method according to claim 1 wherein in (b) the jet of fluid is pressurized to at least 13100 kPa.

3. A method according to claim 1 wherein in (b) the jet of pressurized fluid is at an angle of from about 10 to about 90 degrees with respect to the textured surface, and the jet of pressurized fluid fans out at an angle of from about zero degrees to about 45 degrees.

4. A method according to claim 1 wherein (a) comprises grit blasting a surface of the component to form a textured surface.

5. A method according to claim 1 wherein the component comprises at least one of an enclosure wall, chamber shield, target, cover ring, deposition ring, support ring, insulator ring, coil, coil support, shutter disk, and a surface of the substrate support.

6. A method according to claim 1 wherein the water comprises untreated or tap water.

7. A method according to claim 1 wherein the water is treated by de-ionization, reverse osmosis, ultra-violet radiation, carbon filtration, or a combination thereof.

8. A method according to claim 1 further comprising passing a pressurized flow of nitrogen gas over the textured surface of the component.

9. A method according to claim 1 further comprising immersing the textured surface of the component in a cleaning bath solution.

10. A method according to claim 1 comprising rinsing the textured surface of the component with a chemical solution comprising an aqueous solution of one or more of HF and $HNO_3$.

11. A component fabricated by a process comprising the cleaning method of claim 1, wherein the component comprises a textured surface that is substantially absent adhered or loose particles.

12. A method of cleaning a substrate processing chamber component, the method comprising:
    (a) scanning an electromagnetic energy beam across a surface of a substrate processing chamber component to form a textured surface; and
    (b) sweeping a jet of pressurized fluid across the textured surface of the component to dislodge particles from the textured surface, the jet of pressurized fluid (i) consisting essentially of water that is pressurized to at least 13100 kPa, (ii) fanning out at an angle of from about zero degrees to about 45 degrees, and (iii) being directed at an angle of from about 10 to about 90 degrees with respect to the first textured surface.

13. A method according to claim 12 wherein the water comprises untreated or tap water.

14. A method according to claim 12 wherein the water is treated by de-ionization, reverse osmosis, ultra-violet radiation, carbon filtration, or a combination thereof.

15. A method according to claim 12 further comprising passing a pressurized flow of nitrogen gas over the textured surface of the component, the nitrogen gas flow having a pressure of from about 10 PSI to about 80 PSI.

16. A method according to claim 12 further comprising immersing the textured surface of the component in a cleaning bath solution.

17. A method according to claim 12 comprising rinsing the textured surface of the component with a chemical solution comprising an aqueous solution of one or more of HF and $HNO_3$.

18. A method according to claim 12 wherein (a) comprises grit blasting a surface of the component.

19. A method of forming a substrate processing chamber component, the method comprising:
    (a) forming a textured surface on a substrate processing chamber component by:
        (i) scanning an electromagnetic energy beam across the surface of the component; and
        (ii) grit blasting the surface of the component; and
    (b) cleaning the textured surface of the component by sweeping a jet of pressurized fluid across the textured surface, the fluid consisting essentially of water.

20. A method according to claim 19 further comprising passing a pressurized flow of nitrogen gas over the textured surface of the component, the nitrogen gas flow having a pressure of from about 10 PSI to about 80 PSI.

21. A method according to claim 19 further comprising immersing the textured surface of the component in a cleaning bath solution comprising an aqueous solution of one or more of HF and $HNO_3$.

* * * * *